(12) United States Patent
Sata

(10) Patent No.: US 7,241,633 B2
(45) Date of Patent: Jul. 10, 2007

(54) HEAT TREATMENT APPARATUS AND HEAT TREATMENT METHOD

(75) Inventor: Nobuyuki Sata, Koshi-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/867,712

(22) Filed: Jun. 16, 2004

(65) Prior Publication Data

US 2004/0266222 A1  Dec. 30, 2004

(30) Foreign Application Priority Data

Jun. 16, 2003  (JP) .............................. 2003-171265

(51) Int. Cl.
 *H01L 21/00* (2006.01)
(52) U.S. Cl. ...................... 438/5; 257/E21.529; 438/17
(58) Field of Classification Search .................... 438/5, 438/10, 17; 219/443.1, 444.1, 446.1, 448.11; 257/E21.529
See application file for complete search history.

(56) References Cited

U.S. PATENT DOCUMENTS 5,809,211 A * 9/1998 Anderson et al. ........... 392/416
6,100,506 A * 8/2000 Colelli et al. ............ 219/446.1
6,491,757 B2 * 12/2002 Halpin et al. ............... 118/666
2003/0180970 A1 * 9/2003 Suzuki et al. .................. 438/5
2004/0098145 A1 * 5/2004 Zhenduo et al. .............. 700/42

FOREIGN PATENT DOCUMENTS

| DE | 199 07 497 A1 | 8/2000 |
| JP | 11-008180 | 1/1999 |
| JP | 11-074187 | 3/1999 |
| WO | WO 00/51170 | 8/2000 |

* cited by examiner

*Primary Examiner*—Caridad Everhart
(74) *Attorney, Agent, or Firm*—Oblon, Spivak, McClelland, Maier & Neustadt, P.C.

(57) ABSTRACT

A reference value, which defines electric power to be supplied to a heating element, is generated. Deviation $\Delta T$ of temperature $T_1$ measured by a radiation thermometer from target temperature $T_0$ defined by a target temperature rising curve is determined. Compensation value is determined based on the deviation $\Delta T$ and the temperature $T_1$. The reference value is multiplied by the compensation value. The heating element is supplied with electric power according to the corrected reference value.

13 Claims, 10 Drawing Sheets

| MEASURED TEMPERATURE T₁(°C) \ TEMPERATURE DEVIATION ΔT (°C) | ---- | − 0.2 | − 0.1 | + 0.1 | + 0.2 | ---- |
|---|---|---|---|---|---|---|
| ⋮ | ⋮ | ⋮ | ⋮ | ⋮ | ⋮ | ⋮ |
| 79 | ---- | aa | ab | ac | ad | ---- |
| 80 | ---- | ba | bb | bc | bd | ---- |
| 81 | ---- | ca | cb | cc | cd | ---- |
| ⋮ | ⋮ | ⋮ | ⋮ | ⋮ | ⋮ | ⋮ |

HEAT TREATMENT APPARATUS AND HEAT TREATMENT METHOD

BACKGROUND OF THE INVENTION

1. Field of the Invention

The present invention relates to an apparatus and a method for performing a heat treatment (e.g., a baking treatment) on a substrate, such as a mask substrate (reticle substrate), a semiconductor wafer, or a glass substrate for a liquid crystal display, and more particularly to a technique for controlling a temperature of the surface of the substrate.

2. Description of the Related Art

A baking treatment, which is one sort of the aforementioned heat treatment, is carried out after the substrate is coated with a resist solution, or before or after the substrate is coated with a developing solution, for example. The baking apparatus is incorporated into a coating-and-developing system.

Referring to FIG. 12, a conventional heat treatment apparatus is provided with a hot plate 12 in which a heater 11 is embedded. A substrate G is heated while it is placed on the hot plate 12 via proximity pins 13. The proximity pins 13 separate the back surface of the substrate G from the upper surface of the hot plate 12 by a small distance (e.g., 0.5 millimeters) in order to prevent particles from adhering to the back surface of the substrate G. In general, the temperature control of the substrate G is carried out by measuring the temperature of the surface area of the hot plate 12 by the temperature sensor 14, and by regulating electric power supplied to the heater 11 by a PID (Proportional Integral Differential) controller 15 based on the deviation of the measured temperature from the target temperature.

WO 00/51170 discloses a baking apparatus designed for improving in-plane temperature uniformity over the substrate surface. The apparatus includes a hot plate, which is heated by plural heating elements that can be separately controlled. The temperature of the heating elements is measured and the heating process is controlled by a PID controller. The temperature of the substrate surface facing away from the hot plate is locally measured by a temperature measuring device such as an infrared camera arranged above the substrate, and the temperature distribution over the substrate surface is determined according to the measured temperatures. Set values for the temperature of the individual heating elements are determined and transmitted to the PID controller. The PID controller controls the individual heating elements based on the set values and the measured temperature of the surface areas of the hot plate corresponding to individual heating elements.

JP11-8180A discloses a baking apparatus provided with an infrared temperature sensor which measures the temperature distribution over the entire surface of a resist film coated on a substrate. The temperature of the substrate heated by a heater block is controlled based on the temperature distribution measured by the infrared temperature sensor.

JP11-74187A discloses a temperature control method for a substrate heat treatment apparatus. The substrate is heated by a heater embedded in a hot plate supplied with a fixed electric power during a substrate temperature rising stage. After the substrate temperature reaches heat treatment temperature, the electric power supplied to the heater is controlled by a PID controller.

However, the above conventional techniques have the following problems.

A change in the substrate temperature follows a change in the heater temperature with a time delay. Notably, with a thick substrate such as a mask substrate, the delay time is long. If the substrate temperature is controlled in a PID control mode as disclosed in WO 00/51170, when rapidly raising the temperature of such a thick substrate, the substrate temperature tends to overshoot the target value. Thus, the substrate temperature rising rate must be low. The temperature distribution over the substrate surface during the temperature rising stage is unavoidably wide. Accordingly, if the temperature rising rate is low, the distribution of the time integral of the temperature over the substrate surface becomes considerably wider, resulting in deterioration of in-plane uniformity of the baking treatment.

When the set temperature of each heating element is corrected based on the temperature distribution of the substrate, the set temperature must be significantly changed. However, at the late phase of the temperature rising stage, in other words when the substrate temperature is close to the target temperature, if the set temperature is significantly changed, the substrate temperature becomes unstable or fluctuates. This results in deterioration of in-plane temperature uniformity over the substrate surface, thus resulting in non-uniformity of the thickness, quality and line width of the resist pattern.

Accordingly, the temperature control of WO 00/51170 is not suitable for use in the substrate temperature rising stage. Recently, the layer thickness of semiconductor devices has become thicker, and the line width of the circuit pattern has become narrower. Thus, high in-plane temperature uniformity is required in the substrate temperature rising stage. However, the temperature control of WO 00/51170 does not meet such requirement.

The apparatus of JP11-8180A also controls the heating operation based on the temperature distribution data, which is effective for use in the stable temperature stage, but is not suitable for use in the temperature rising stage.

The apparatus of JP-74187A does not have any means for controlling electric power supplied to the heater, and thus can not respond to the change in actual substrate temperature due to abnormalities such as change in air flow in the processing vessel, or variation in substrate thickness.

SUMMARY OF THE INVENTION

The present invention has been made in view of the foregoing problems. It is therefore the object of the present invention is to provide an apparatus and a method capable of rapidly raising temperature of the substrate up to a predetermined target value, while controlling the substrate temperature. Another object of the present invention is to provide an apparatus and a method that achieve high in-plane temperature uniformity over the substrate surface during temperature rising stage, even if the substrate is heated by plural heating elements.

In order to achieve at least the first objective, the present invention provides a heat treatment apparatus, which includes: a hot plate having a heating element and adapted to support a substrate to be heat treated on or above the hot plate; a first, non-contact thermometer adapted to measure temperature of a surface of the substrate supported by the hot plate without contacting the surface of the substrate; a controller adapted to control electric power supplied to the heating element, the controller including a first control unit and a second control unit, the first control unit being configured to control the electric power in a first control mode during a first stage in which the temperature of the substrate rises from a first temperature to a second temperature, the second control unit being configured to control the electric power in a second control mode during a second stage after the first stage, wherein the first control unit includes: a reference-power-value generator configured to generate reference value of the electric power during the first stage, the reference value being determined beforehand so that, if the electric power is supplied to the heating element according to the reference value, an actual temperature of the substrate rises to substantially trace a target temperature-rising curve that defines change in a target temperature of the substrate with time; a subtractor configured to calculate deviation of temperature of the substrate measured by the first thermometer at a first point of time during the first stage from the target temperature at the first point of time defined by the target temperature-rising curve; a compensation-value generator configured to generate at least one compensation value which is a function of the deviation, and of the temperature measured by the first thermometer at the first point of time or the target temperature at the first point of time; and a power-value corrector configured to correct the reference value by using the compensation value, thereby generating a corrected power value, which is a value of the electric power to be supplied to the heating element.

The present invention also provides a heat treatment method, which includes the steps of: placing a substrate on or above a hot plate having a heating element; controlling electric power supplied to the heating element in a first control mode to raise temperature of the substrate, the controlling step including the steps of: generating reference value of electric power to be supplied to the heating element, the reference value being determined beforehand so that, if the electric power is supplied to the heating element according to the reference value, an actual temperature of the substrate rises to substantially trace a target temperature-rising curve that defines a change in target temperature of substrate with time; supplying electric power specified by the reference value to the heating element to heat the substrate; performing non-contact measurement of temperature of a surface of the substrate at a first point of time; determining a deviation of the measured temperature from the target temperature at the first point of time defined by the target temperature rising curve; determining at least one compensation value which is a function of the deviation, and of the temperature measured by the first thermometer at the first point of time or the target temperature at the first point of time; correcting the reference value by using the compensation value; supplying electric power specified by the corrected reference value to the heating element to heat the substrate.

Further features of the present invention will become apparent in view of the following description of the preferred embodiments and the attached drawings.

DESCRIPTION OF THE PREFERRED EMBODIMENTS

Figure 1:
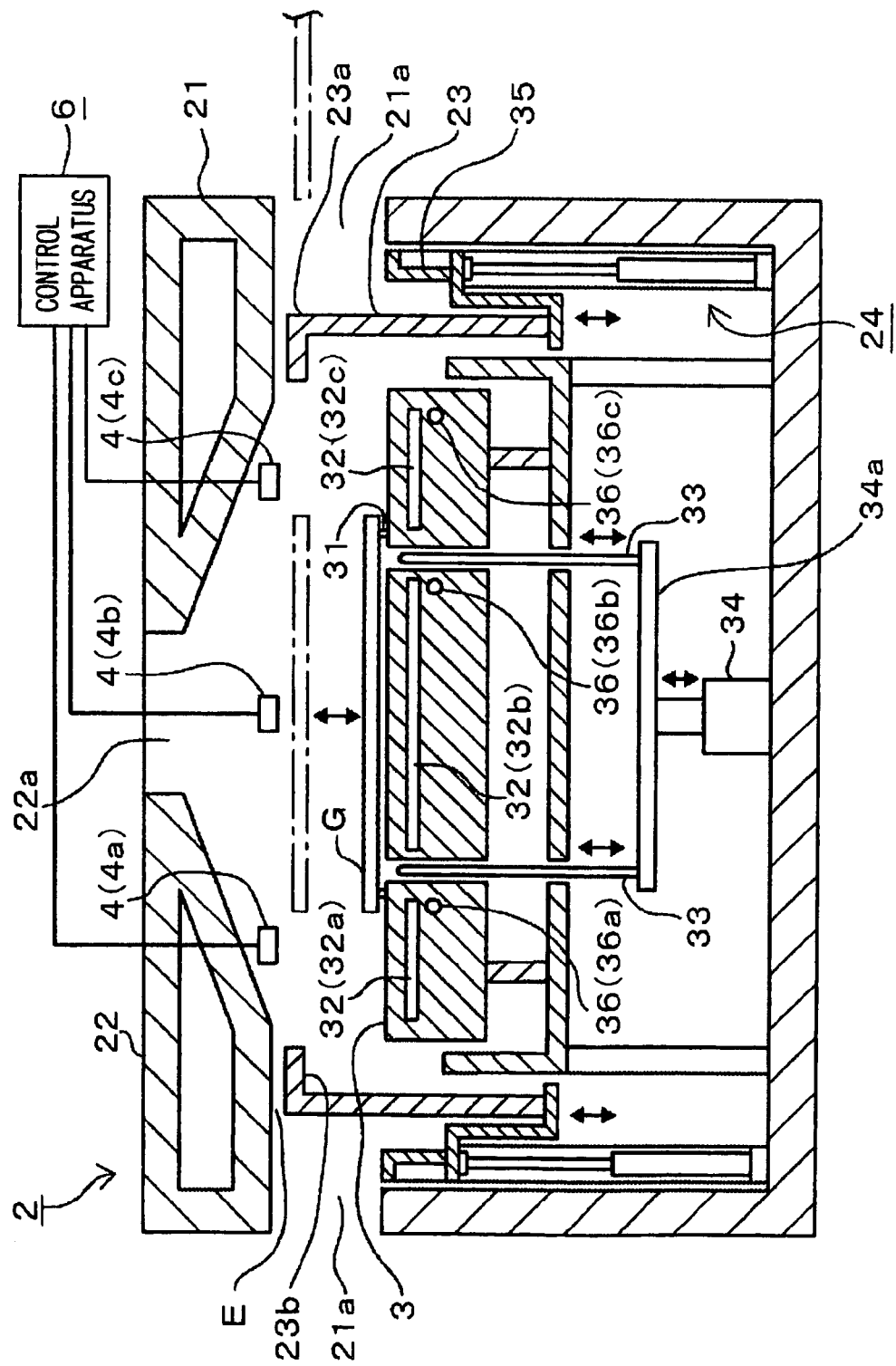
FIG. 1 is a vertical cross-sectional view of a heat treatment apparatus in one embodiment of the present invention.

A preferred embodiment of the heat treatment apparatus according to the present invention will be described for an example in which the heat treatment apparatus is a baking apparatus designed for baking a mask substrate (reticle substrate) coated with a resist solution.

First, the structure of the heat treatment apparatus will be described with reference to FIG. 1.

The heat treatment apparatus 2 removes a solvent contained in a resist solution coated on a substrate G. Referring to FIG. 1, a processing vessel 21 has a side wall provided with a circumferential opening 21a, through which a substrate transfer arm (not shown) can access the interior of the processing vessel 21. An exhaust port 22a is formed at the central area of a ceiling of the processing vessel 21. An exhaust system is connected to the exhaust port 22a to discharge the atmosphere in the processing vessel. The opening 21a can be closed by a cylindrical shutter 23. The shutter 23 is composed of a cylindrical main body 23a arranged outside a hot plate 3 (described later) and a horizontal piece 23b connected to an upper end of the main body 23a and directed inward. The shutter 23 moves vertically by an elevating mechanism 24 such as an air cylinder, and can stop at a position at which the horizontal piece 23b locates at the upper region of the opening 21a and the shutter 23 almost closes the opening 21a leaving a small gap E.

The hot plate 3 is arranged in the processing vessel 21 at a position where the not-shown transfer arm can deliver and remove the substrate G to and from the hot plate 3. The substrate G is heated by the hot plate 3 while being supported by the hot plate 3 through proximity pins 31 in such a manner that a gap of about 0.5 millimeters is formed between an upper surface of the hot plate 31 and the back surface of the substrate G. A hot plate without proximity pins may be used instead of the illustrated hot plate 3.

The hot plate 3 is provided with four support pins 33 for transferring the substrate G between the not-shown transfer arm and the hot plate 3. The support pins 33 are connected to an elevation mechanism 34 through a support plate 34a arranged below the hot plate 3, thereby the tip portion of each support pin 33 can protrude from and retract into the hot plate 3.

Figure 2:
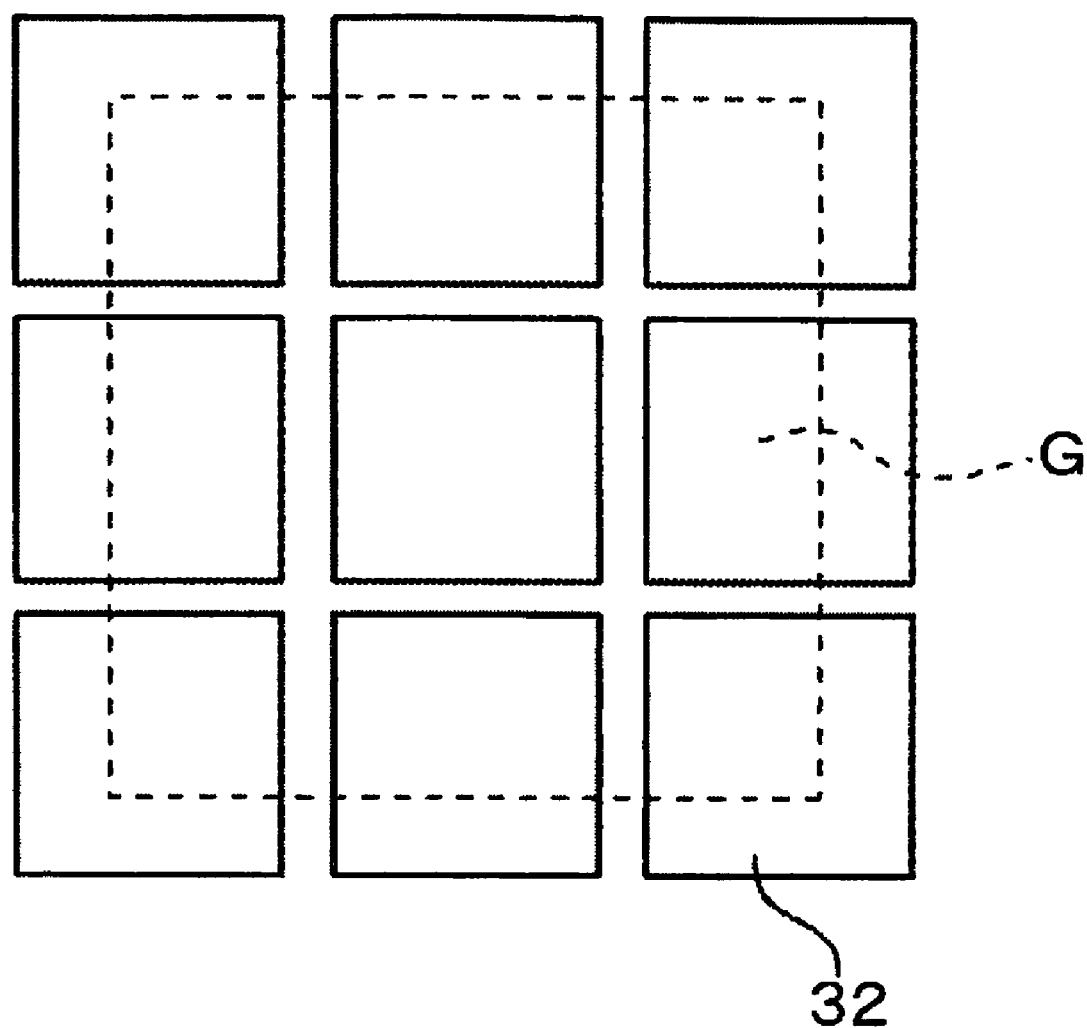
FIG. 2 is a top plan view of a hot plate of the heat treatment apparatus shown in FIG. 1, schematically showing an arrangement of heating elements.

The hot plate 3 is made of a metallic material having good heat conductivity such as an aluminum alloy or a stainless steel, or a ceramic material such as aluminum nitride or silicon carbide. The hot plate 3 is provided therein with heating elements 32, each of which is typically an electric resistance heater. The hot plate 3 is divided into nine heating areas, in each of which one heating element 32 is arranged to heat the heating area. In the illustrated embodiment, nine heating elements 32 are arranged in the hot plate 3 in a 3×3 matrix pattern, as shown in FIG. 2.

Figure 3:
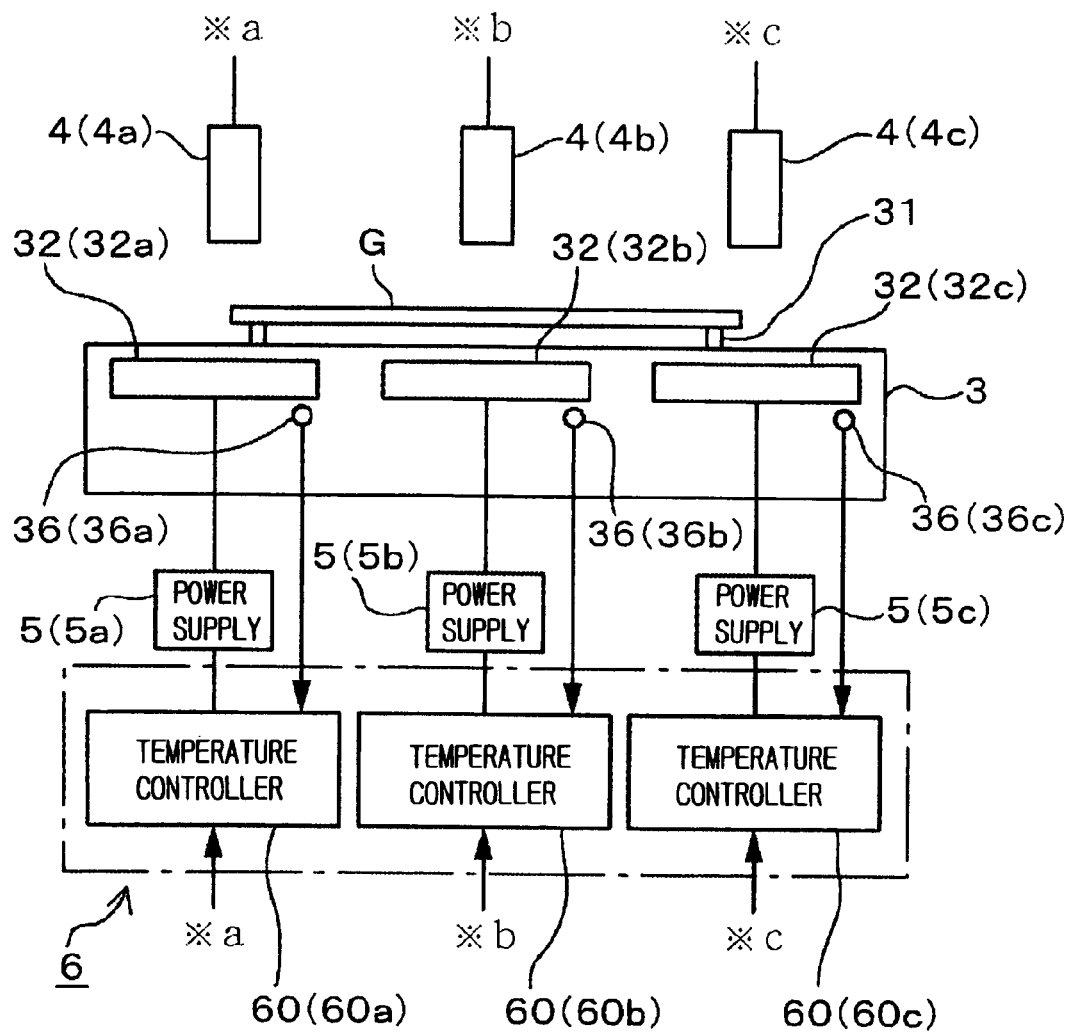
FIG. 3 is a block diagram schematically showing a temperature control system of the heat treatment apparatus shown in FIG. 1.
Figure 4:
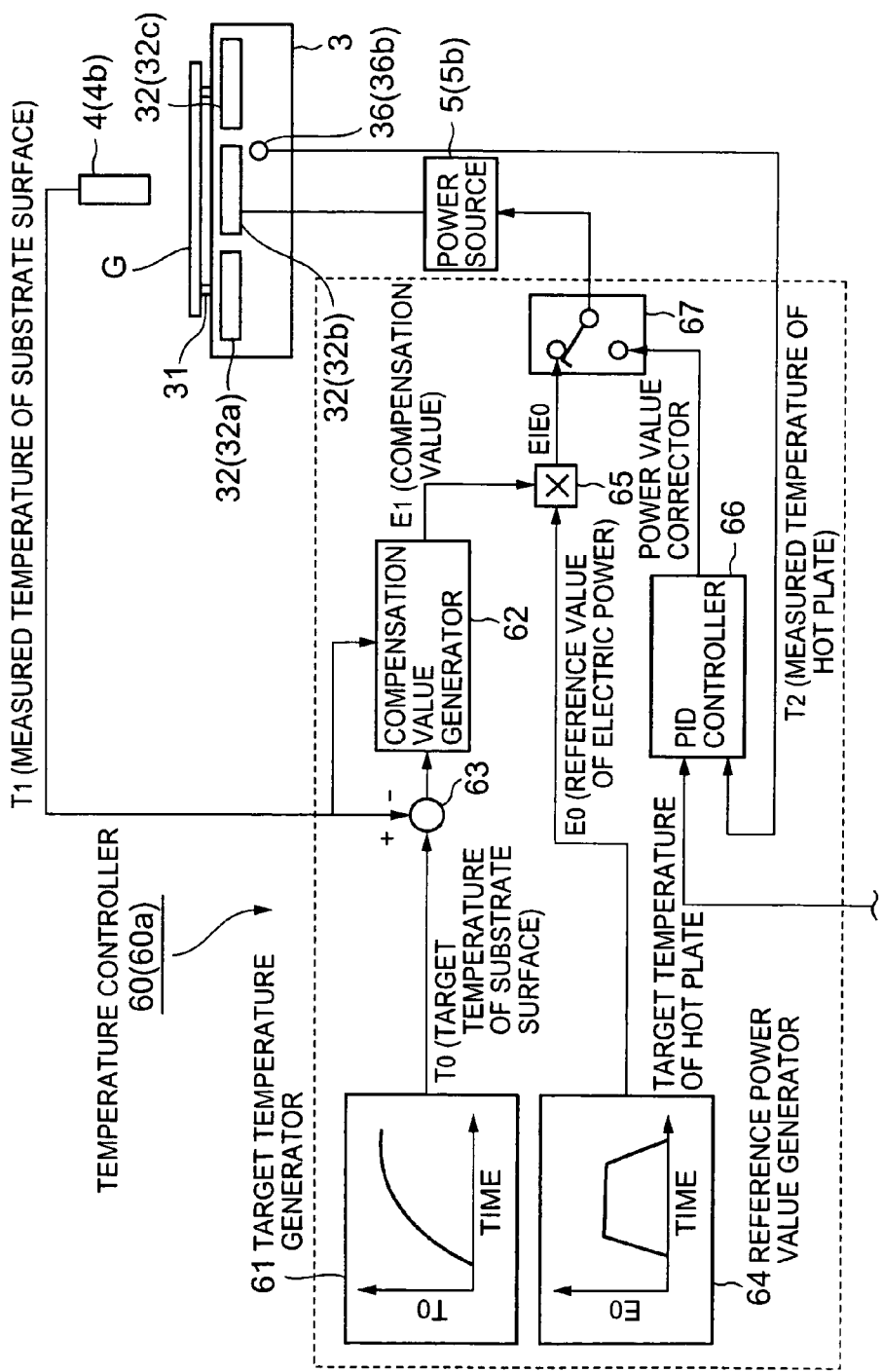
FIG. 4 is a block diagram showing the structure of a temperature controller in the control system shown in FIG. 3.

As a vertical cross-sectional view of the hot plate 3 is shown in FIG. 1, only three heating elements 32 appear in FIG. 1. For the sake of convenience of explanation, only three of the nine heating elements 32 and the component parts relating to the three heating elements 32 will be described hereinafter. The reference numerals 32a, 32b and 32c are respectively assigned to the three heating elements 32, as shown in FIGS. 1, 3 and 4.

Temperature sensors 36a, 36b and 36c (36), each of which is typically a thermocouple, are arranged adjacent to heating elements 32a, 32b and 32c (32), respectively. The temperature sensors 36a, 36b and 36c are embedded in the hot plate 3 to measure the temperature of the respective heating areas of the hot plate 3.

The arrangement of the heating areas and the heating elements 32 is not limited to that as mentioned above. The hot plate 3 may be divided into two heating areas, one being the central area of the hot plate 3 and provided with a heating element having a size slightly smaller than that of the substrate G, and the other being a peripheral area of the hot plate 3 surrounding a substrate placement area and provided with a heating element having a ring shape.

One or more non-contact temperature measuring devices (i.e., thermometers) 4 are arranged in the processing vessel 21 and above the substrate G to oppose the hot plate 3. The temperature measuring device 4 is adapted to perform non-contact temperature measurement of the front (upper) surface of the substrate G. The temperature measuring device 4 may be a radiation thermometer, an infrared camera or a heat flow meter. In the illustrated embodiment, each temperature measuring device 4 is a radiation thermometer (hereinafter referred to as "radiation thermometer 4"). It should be noted that only one infrared camera may be used as the temperature measuring device instead of the radiation thermometers 4 if it is capable of measuring the temperature of each area of the substrate surface locally.

The number of the radiation thermometers 4 is equal to the number of the heating areas (i.e., the number of the heating elements 32). Each radiation thermometer 4 opposes each area of the substrate G corresponding to each heating area of the hot plate 3, in order to measure the surface temperature of each area of the substrate G separately. In FIGS. 1, 3 and 4, there appear only three radiation thermometers 42a, 42b and 42c corresponding to the heating areas heated by the heating elements 32a, 32b and 32c. The radiation thermometer 4 measures the intensity of the radiant heat emitted by the target object (i.e., substrate G), and determines the surface temperature of the target object based on the measured intensity and the emissivity of the target object.

FIG. 3 schematically shows the control system for controlling electric power to be supplied to the heating elements 32. The control system includes sub control systems each configured to control electric power to be supplied to each heating elements 32 separately.

Each sub control system includes: the heating element 32 (32a, 32b, 32c); the radiation thermometer 4 (4a, 4b, 4c); a power source 5 (5a, 5b, 5c) that supplies electric power to the corresponding heating element 32 (32a, 32b, 32c); and a temperature controller 60 (60a, 60b, 60c) that controls the corresponding power source 5 (5a, 5b, 5c) to regulate electric power supplied from the corresponding power source 5 (5a, 5b, 5c) to the corresponding heating element 32 (32a, 32b, 32c)

Each controller 60 is a part of an integrated control apparatus 6. Each controller 60 receives a signal representing a temperature of each heating area of the hot plate 3 measured by the temperature sensor 36 (36a, 36b, 36c) and a signal representing a temperature of each area of the substrate G measured by the radiation thermometer 4 (4a, 4b, 4c).

The temperature controllers 60 (60a, 60b, 60c) will be described in detail with reference to FIG. 4. As the temperature controllers 60 have the same structure and function, only one of them will be described.

The controller 60 includes a first control unit (61-64) and a second control unit 66. The first control unit comprises a target-temperature generator 61, a compensation-value generator 62, a subtractor 63, a reference power value generator 64, and a power-value corrector 65.

Figures 5, 6:
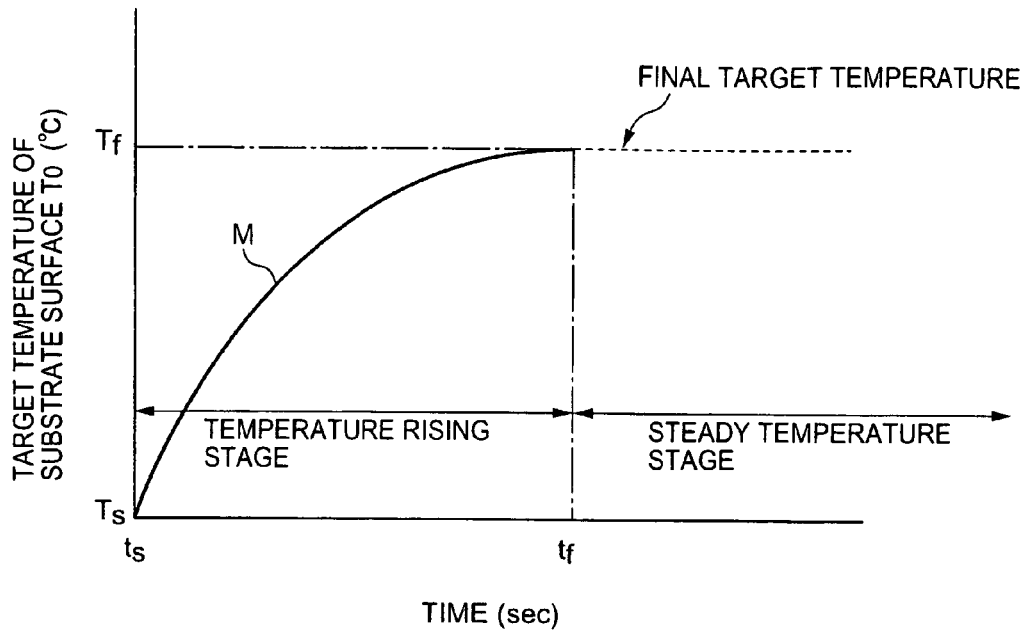
FIG. 5 is a graph showing a target temperature rising curve stored in a target temperature generator of the temperature controller.
FIG. 6 shows a table stored in a compensation-value generator of the temperature controller.

The target temperature generator 61 has a data storage (not shown) that stores a target temperature rising curve (temperature rising pattern), which defines a change in target temperature of the substrate surface with time during a temperature rising stage, as shown in FIG. 5.

In FIG. 5, ts is a point of time at which the temperature rising stage starts, and tf is a point of time at which the temperature rising stage finishes. In the illustrated embodiment, the point of time ts corressponds to a point of time at which the substrate G is placed on the hot plate 3, and the point of time tf corresponds to a point of time at which the temperature of the substrate surface substantially reaches a final target temperature Tf, which is generally called "heat treatment temperature" or "process temperature" of the substrate G at which the substrate G is maintained for a predetermined time period in order for the coated solution to be completely baked. In the illustrated embodiment, the final target temperature Tf (see FIG. 5) of the substrate G is 120° C. and a temperature rising time (tf−ts) is 200 seconds. Ts is temperature of the substrate G at the point of time ts, and is typically equal to room temperature or somewhat above. The target temperature generator 61 outputs a target temperature T0 (see FIG. 4), which varies with time, according to the target temperature rising curve M.

The subtractor 63 is configured to calculate a deviation ($\Delta T=T0-T1$) of the temperature T1 of the surface of the substrate measured by the thermometer 4 at a certain point of time during the temperature rising stage from the target temperature T0 at said certain point of time defined by the target temperature rising curve M.

The reference power value generator 64 has a data storage that stores a reference power pattern R, which defines change in electric power to be supplied from the power source 5 to the heating element 32 during the temperature rising stage. The reference power value generator 64 outputs reference value E0 (see FIG. 4) of the electric power to be supplied from the power source 5 to the heating element 32 according to the reference power pattern R.

The reference power pattern R is experimentally determined beforehand so that the change in the measured temperature T1 substrantially coincides with change in actual temperature of the substrate G if the power source 5 supplies electric power to the heating element 32 according to the reference power pattern R.

Figure 7:
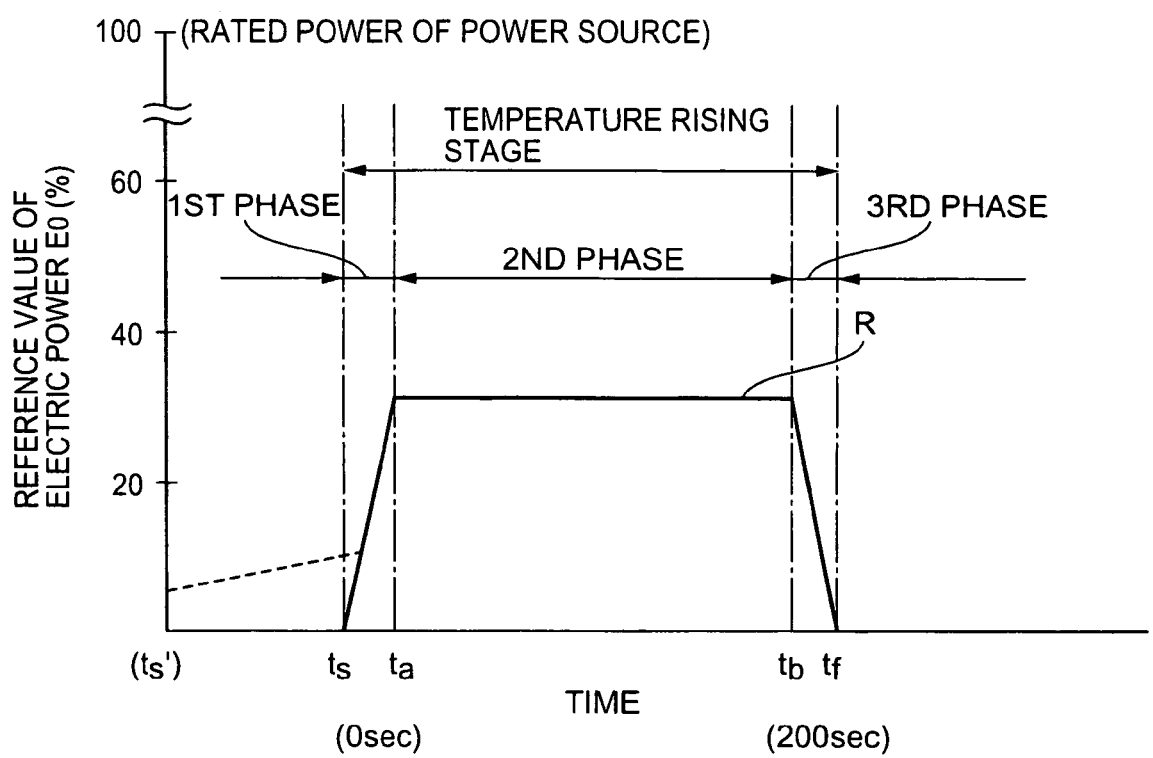
FIG. 7 is a graph showing a reference power pattern stored in a reference electric power generator of the temperature controller.

In the illustrated embodiment, the reference power pattern R is such as shown in FIG. 7. During the first phase of the temperature rising stage from the point of time ts to the point of time ta, the reference power value generator 64 generates reference value E0 of the electric power which increases gradually with time, in order to avoid thermal deformation of the substrate G. During the second phase of the temperature rising stage from the point of time ta to the point of time tb, the reference power value generator 64 generates a fixed reference value E0. During the third phase of the temperature rising stage from the point of time tb to the point of time tf, the reference power value generator 64 generates a reference value E0 which decreased gradually with time, for the purpose of smooth transition to the subsequent heating stage (steady-temperature stage, see FIG. 5) during which the temperature control is carried out by the PID controller 66, or the second control unit.

Preferably, different reference power patterns R are assigned to different temperature controllers 60. As the temperature of the central area of the substrate G tends to be higher than that of the peripheral area of the substrate G, the reference value E0 defined by the reference power pattern R assigned to the temperature controller 60 which controls the heating element 32 at the central area of the hot plate 3 is preferably somewhat smaller than the reference value E0 defined by the reference power pattern R assigned to the temperature controller 60 which controls the heating element 32 at the peripheral area of the hot plate 3.

The compensation-value generator 62 receives the measured temperature T1 from the radiation thermometer 4 and the deviation $\Delta T$ from the subtractor 63. The compensation-value generator 62 has a table which represents a relationship between a compensation value E1 for correcting the reference value E0 and the measured temperature T1 and the deviation $\Delta T$. In other words, the compensation value E1 is a function of the measured temperature T1 and the deviation $\Delta T$. The compensation values E1 wrote in the table is determined beforehand by an experiment and/or a simulation. The compensation-value generator 62 determines a compensation value E1 based on the measured temperature T1 and the deviation $\Delta T$ referring to the table, and outputs the compensation value E1. In the illustrated embodiment, the compensation value E1 is a magnification factor, by which the reference value E1 of the electric power is multiplied. For example, if the measured temperature T1 is 79° C. and the deviation $\Delta T$ is −0.1° C., the compensation value E1 is "ab" (e.g., "ab"=1.05), as shown in FIG. 6.

Different compensation values E1 are assigned to the same temperature deviation ($\Delta T=T1-T0$), if the measured temperature T1 is different. This is because the difference between the calorie which the substrate G received from the hot plate 3 and the calorie which the substrate G releases (dissipates) depends on the actual substrate temperature.

The compensation value E1 may be "1" (this means that no correction is conducted), if the absolute value of the deviation $\Delta T$ is small (for example, the absolute value of the deviation $\Delta T$ is not greater than 0.1° C.). This is because it is possible that oversensitive correction (control) could prevent smooth temperature control.

The compensation value E1 may be determined based on the deviation $\Delta T$ and the target temperature T0 used for calculating the deviation $\Delta T$. The compensation value E1 may be determined based on the deviation $\Delta T$ and the time elapsed from the point of time ts. It should be noted that, in both cases, the compensation value E1 is a function of the deviation $\Delta T$ and the target temperature T0 used for calculating the deviation $\Delta T$. This is because the time elapsed from the point of time ts and the target temperature T0 at the time has one-to-one correspondence. In this case, "target temperature T0" or "time elapsed from the point of time ts" is wrote in the table of FIG. 6, instead of "measured temperature T1."

It should also be noted that compensation-value generator 62 may store a mathematical equation (function) which expresses the relationship between the compensation value E1 and the measured temperature T1 (or the target temperature T0 or time elapsed from the point of time ts) and the deviation $\Delta T$, instead of the table as shown in FIG. 6.

The power-value corrector 65 comprises a multiplier, and multiplies the reference value E0 of the electric power by the compensation value E1. The power-value corrector 65 outputs the multiplication result E1E0 as a corrected reference value to the power source 5.

The second control unit 66 of the controller comprises a PID controller, which itself is well-known in the art. The second control unit 66 determines the electric power to be supplied from the power source 5 to the heating element 32 based on the temperature T2 of the hot plate 3 measured by the temperature sensor 36 and the target temperature (which is typically equal to the final target temperature Tf) of the hot plate 3 according to a conventional PID control method, and sends the value of the electric power thus determined to the power source 5.

The controller 60 has a switch 67 configured to selectively connect the first or second control unit of the controller 60 to the power source 5 in order to switch the temperature control mode. The power source 5 adjusts the electric power supplied to the heating element 32 according to the command signal (i.e., the value E1E0 or the output of the PID controller 66) received from the connected control unit.

In a typical embodiment, the temperature controller 60 comprises a computer having electronic devices including a CPU and suitable memory means. The memory means stores a control program, the target temperature-rising curve M, the reference power pattern R, the table, etc. The block diagram shown in FIG. 4 represents the functions achieved by the computer hardware and the computer program. However, the temperature controller 60 may be composed of plural electronic units or circuits each having one or more functions corresponding to one or more of the functional blocks of FIG. 4

The operation of the heat treatment apparatus will be described. Referring to FIG. 2, the shutter 23 is lowered, and then the not-shown transfer arm holding a substrate G is entered into the interior of the processing vessel 21 through the opening 21a. Upon cooperation of the not-shown transfer arm and the support pins 33, the substrate G is placed on or above the hot plate 3, in other words, supported by the hot plate 3 via the proximity pins 31.

After the not-shown transfer arm is withdrawn from the processing vessel 21, the shutter 23 rises to incompletely close the opening 21a leaving the small gap E to establish a semi-closed state of the processing vessel 21. In this state, the substrate G is subjected to a predetermined heat treatment, while the interior of the processing vessel 21 is evacuated and while each power sources 5 supplies electric power to each heating element 32 in the hot plate 3 according to the control signal sent from each temperature controller 60 (control apparatus 6). The following description will be made for one control subsystem.

The power source 5 has been controlled by the second control unit 66 in a PID control mode to supply electric power to the heating element 32, before the substrate G is placed on the hot plate 3.

At a point of time ts when the substrate G is placed on the hot plate 3, the switch 67 is switched from the second control unit side to the first control unit side. The switching may be triggered by a signal, which represents that the support pins 33 are completely lowered, generated by a limit switch not shown. At the same time, the reference power value generator 64 starts outputting the reference value E0 of the electric power, and target temperature generator 61 starts outputting the target temperature T0.

During the temperature rising stage, preferably in the second phase (see FIG. 7), the determination of the compensation value E1 is conducted at least one time, preferably a few or several times, at predetermined timings. The determination may be carried out more frequently, however, it is not necessary and not preferable, because too frequent determination results in complexity of the control and prevention of smooth temperature rising. In a typical embodiment, the determination of the compensation value E1 is carried out two or three times.

The deviation ΔT of the measured temperature T1 from the target temperature T0 is calculated by the subtractor 63, and the compensation-value generator 62 determines at least one compensation value E1 based on the deviation ΔT and measured temperature T1 by using a table shown in FIG. 6. The power-value corrector 65 multiplies the reference value E0 by the compensation value E1 to output a corrected value E1 E0, according to which the power source 5 supplies electric power to the heating element 32.

Figure 8A:
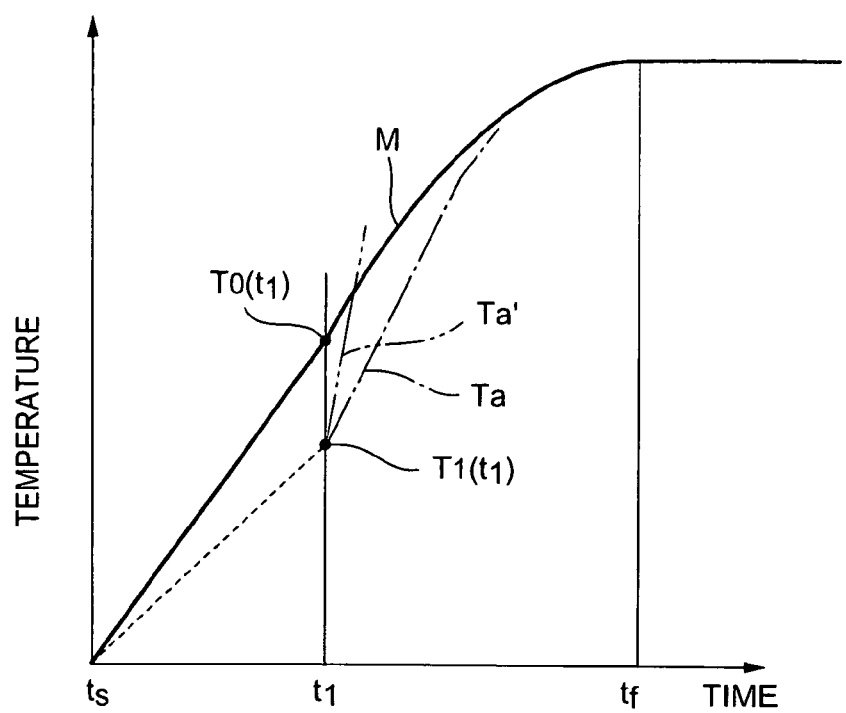
FIGS. 8A and 8B are graphs for explanation of a compensation value.

The compensation value E1 will be described in detail, with reference to FIG. 8A. Assuming that the target temperature is T0(t1) and the measured temperature T1(t1) at the point of time t1, the compensation value generator 62 generates a compensation value E1 based on the deviation ΔT(t1)=T1 (t1)–T0(t1). The compensation value E1 may be determined so that, according to which, the actual temperature rising curve Ta (indicated by single-dashed chain lines) gradually approaches the target temperature rising curve M, and the actual temperature (i.e., measured temperature T1) coincides with the final target temperature Tf at the point of time tf (i.e., the end of the temperature rising stage). In this case, the compensation-value generator 62 continues to output a fixed compensation value E1 after the point of time t1 unless the next determination of the compensation value E1 is conducted. This method achieves a simple control procedure.

Alternatively, the compensation value E1 may be determined so that, according to which, the actual temperature rising curve Ta' (indicated by double-dashed chain lines in FIG. 8A) crosses the target temperature rising curve M. In this case, the compensation value E1 must be changed thereafter at least once. However, this method enables the time integral of the actual temperature to be essentially the same as the time integral of the temperature which rises according to the target temperature curve M.

Figure 8B:
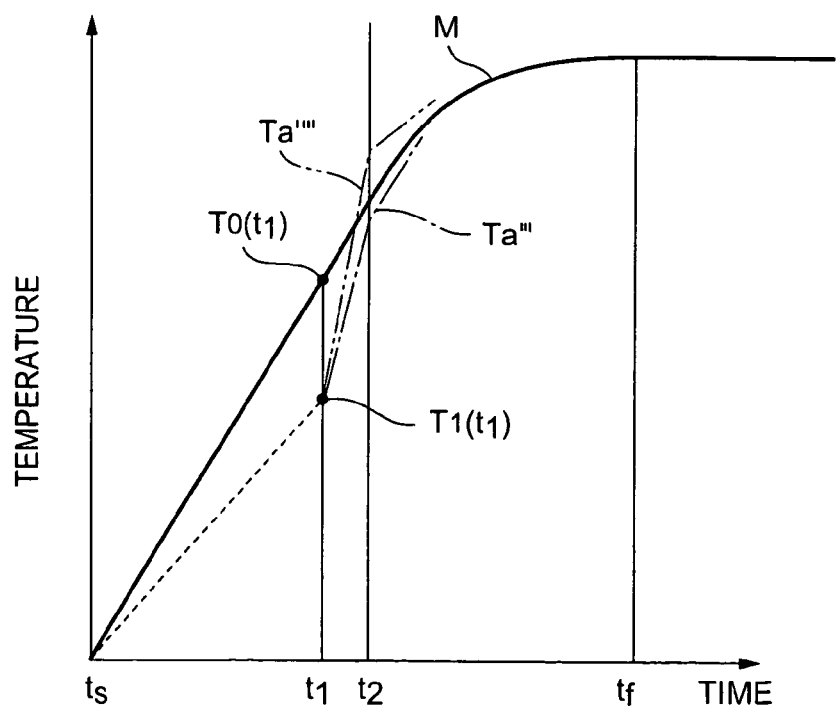

Alternatively, the compensation value E1 may be determined so that the actual temperature rising curve Ta'" (indicated by single-dashed chain lines) will rapidly approach the target temperature rising curve M, as shown in FIG. 8B. In this case, the compensation-value generator 62 generator is configured to generate a first compensation value E1' during a time period from the point of time ti to a point of time t2, and generates a second compensation value E1" after the time point t2. Two different compensation values E1' and E1" are assigned to each cell of the table of the CV-generator 62. The absolute value of the first compensation value E1' is greater than that of the second compensation value E1". If the deviation ΔT(t1) is negative, E1' and E1" are 1.2 and 1.05, respectively, for example. This method reduces the deviation of the time integral of the actual temperature from the time integral of the temperature which rises according to the target temperature curve M.

Alternatively, the compensation values E1' and E1" may be determined so that the actual temperature rising curve Ta"" (indicated by double-dashed chain lines in FIG. 8B) will rapidly cross the target temperature rising curve M, and thereafter approach the target temperature rising curve M. If the deviation ΔT(t1) is negative, E1' and E1" are 1.3 and 0.8, respectively, for example.

When the temperature of the substrate surface reaches the final target temperature Tf, the switch 67 is switched to the second control unit 66 side, and thus the electric power to be supplied to the heating element 32 will be controlled in the PID control mode. It is not absolutely necessary to switch the first control unit side to the second control unit side at an exact point of time when the temperature of the substrate surface reaches a temperature exactly equal to the final target temperature Tf. The switching may be carried out slightly before the temperature of the substrate surface reaches the final target temperature Tf, or slightly after the temperature of the substrate surface reaches the final target temperature Tf. The switching may be carried out when the measured temperature T1 of the radiation thermometer 4 reaches the final target temperature Tf. Alternatively, the switching may be carried out when a predetermined time period has elapsed from the point of time ts, in other words, when the substrate temperature is expected to reach the final target temperature Tf. If the hot plate 3 has plural heating elements 32, the switching is preferably carried out based on the elapsed time period, for simplicity of control. In this case, the controller 60 is provided with a timer, not shown.

In the aforementioned embodiment, the point of time ts when the temperature rising stage starts or the first control unit starts the controlling procedure, coincides with the point of time when the substrate G is placed on the hot plate 3. In other words, the controller 60 deems the point of time when the substrate G is placed on the hot plate 3 to be the point of time ts when the temperature rising stage starts. However, the point of time ts may be another point of time when or after the temperature of the substrate G starts to rise due to heat dissipated from the heat plate 3, such as a point of time when the substrate G is entered into the interior of the processing vessel 21, or a point of time when the distance between the hot plate 3 and substrate G becomes less than a predetermined value. The chain lines in FIG. 7 show change in the reference value E1 of the electric power in a case where the point of time ts' at which the temperature rising stage starts is a point of time when the substrate starts to enter the interior of the processing vessel 21. During the time period corresponding to the chain lines, the electric power is supplied to the heating elements 32 in order to avoid lowering the temperature of the hot plate 3 before the substrate G is placed on the hot plate due to opening of the shutter 23. In this case, electric power is supplied to the heating element 32 according to the reference value generated by the reference power value generator 64, and adjustment of the electric power based on the temperature measurement is not conducted.

Figure 9:
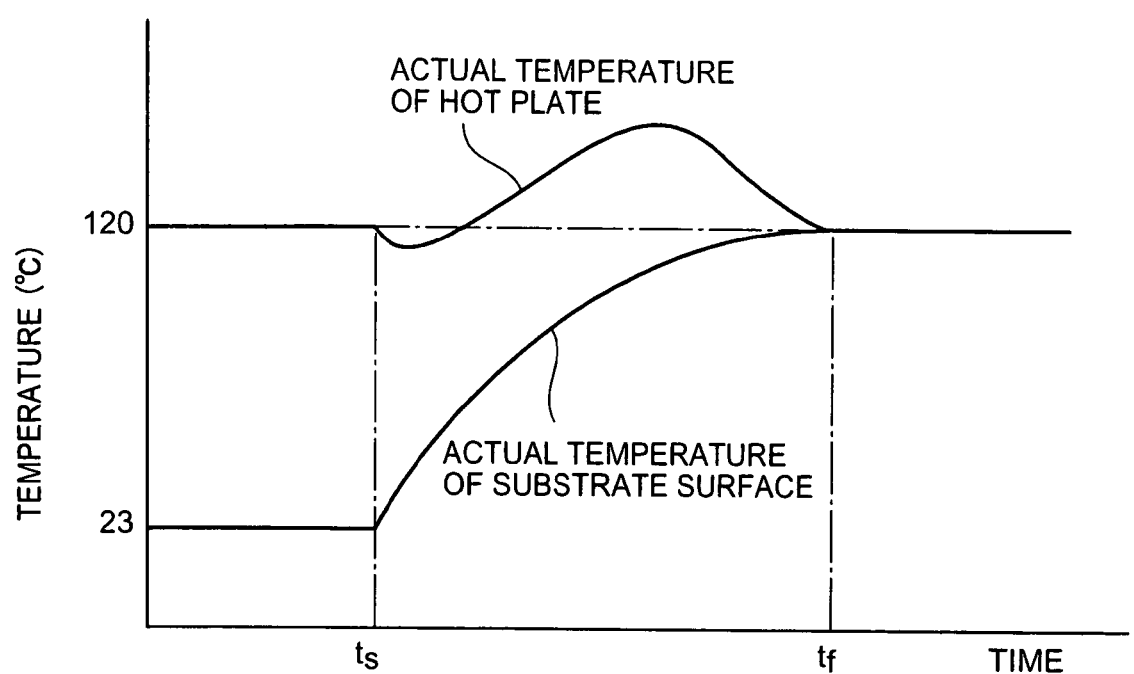
FIG. 9 is a graph showing change in actual temperature of the substrate and the hot plate with time.

FIG. 9 shows change in the actual temperature of the hot plate 3 and the change in actual temperature of the substrate G before and after the substrate G is placed on the hot plate 3.

According to the above embodiment, in the temperature rising stage, the substrate temperature is not controlled by a PID control mode, but is controlled based on the reference value E0 of the electric power which is determined beforehand so that the substrate temperature rises to follow the target temperature curve M. Accordingly, the substrate temperature rises up to the final target temperature Tf smoothly and rapidly, resulting in improvement of throughput of the heat treatment apparatus.

In addition, if the actual substrate temperature deviates from the target temperature T0 due to the variation in the substrate dimension (e.g., thickness) or the change in air flow in the processing vessel, the electric power to be supplied to each heating element 32 is corrected by using the compensation value E1 determined based on the measured substrate temperature T1 and the deviation ΔT. Accordingly, high in-plane temperature uniformity over the substrate surface can be achieved during the temperature rising stage. Moreover, as the substrate temperature raises rapidly, the distribution of the time integral of the temperature over the substrate surface can be narrowed.

The above control operation is applicable to a heat treatment system having a hot plate provided with a single heating element. Also in such a case, the same advantage is achieved.

The temperature controller 60 may further include an alarm means which generates an alarm when the deviation ΔT is beyond a predetermined range. In such a case, the system (e.g., a coating-and-developing system) including the heat treatment apparatus may stop transferring the succeeding substrate G and/or stop the operation of the heat treatment apparatus 2. According to the above, if the substrate G is placed on the hot plate 3 while considerably dislocated from the predetermined position, or if the air flow in the processing vessel 3 is abnormal, such abnormality can be detected by monitoring the deviation ΔT, and the operator can take proper countermeasure to correct such abnormality.

In the aforementioned embodiment, the power-value corrector 65 is a multiplier that multiplies the reference value E0 of the electric power by the compensation value E1. In this case, the compensation value E1 is a magnification factor. However, the power-value corrector 65 may be an adder that adds (if ΔT is negative) or subtracts (if ΔT is positive) a compensation value E1 to or from the reference value E0. In this case, the compensation value E1 having the same dimension as that of the reference value E0 is written in the table of the compensation-value generator 62.

The present invention is applicable not only to the heating of the substrate coated with a resist solution but also the drying of the substrate after washing, the post-exposure baking of the substrate after exposure, or the post baking of the substrate after developing.

Figure 10:
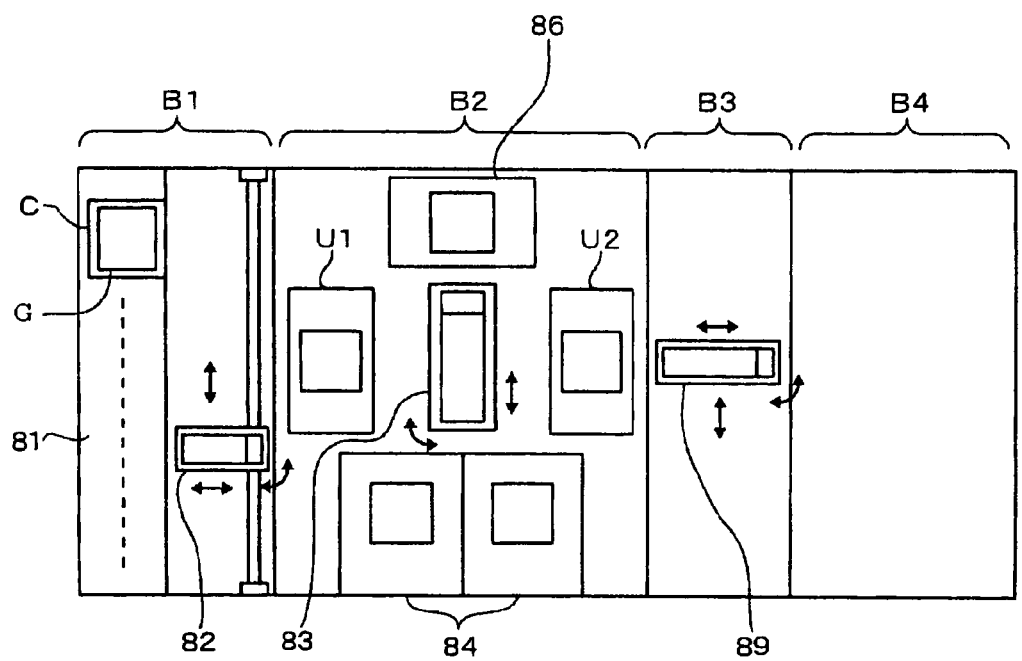
FIG. 10 is a top plan view of a coating-and-developing system in which the heat treatment apparatus shown in FIG. 1 is incorporated.
Figure 11:
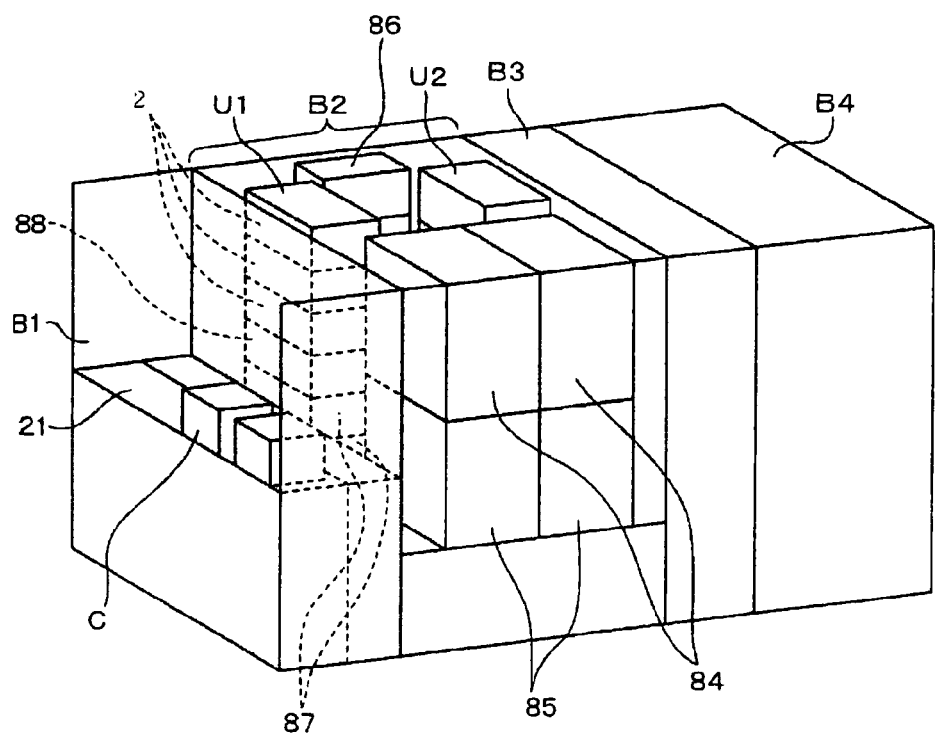
FIG. 11 is a perspective view of the coating-and-developing system shown in FIG. 10.
Figure 12:
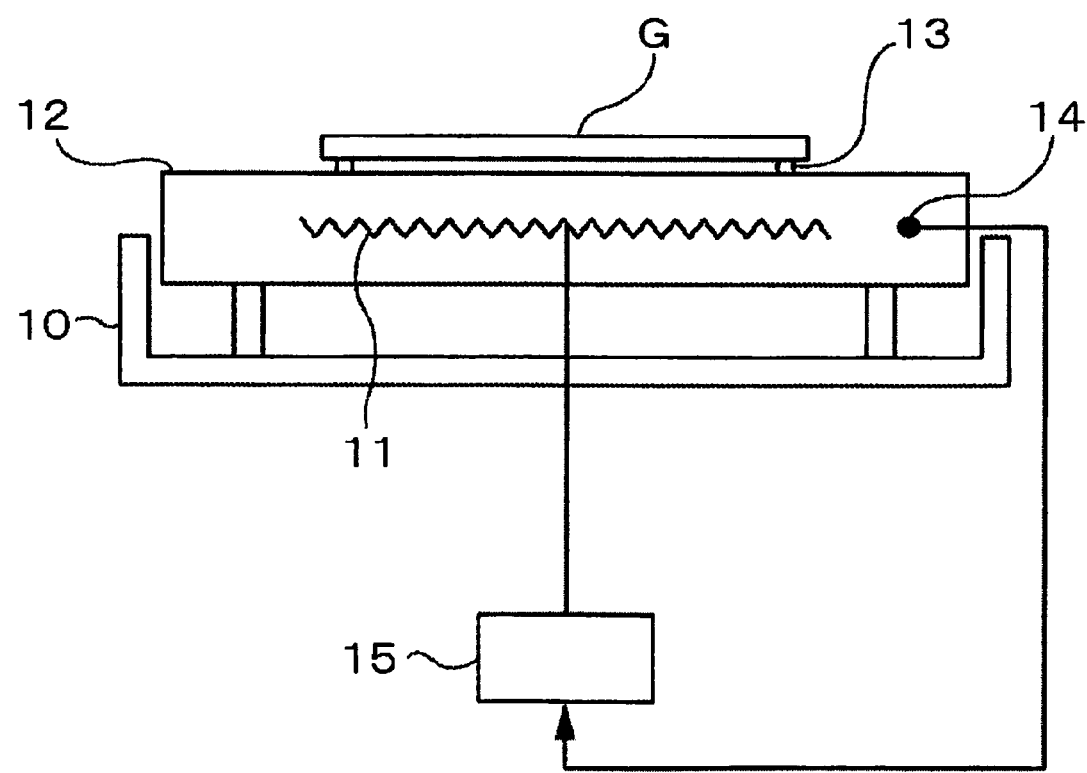
FIG. 12 schematically shows a conventional heat treatment apparatus.

A coating film forming system, in which the heat treatment apparatus is incorporated, will be briefly described with reference to FIGS. 10 and 11. The system includes a carrier block B1. The carrier block B1 includes a carrier stage 81 and a substrate transfer member 82. The system delivers and receives a carrier C containing a plurality of (e.g., 5) substrates G (e.g., mask substrates) to and from an external carrier conveyer via the carrier state 81.

The substrate transfer member 82 is movable back and forth and right and left, is movable vertically, and is turnable about a vertical axis. The substrate transfer member 82 removes a substrate G from a carrier C, and delivers the substrate G to the processing section B2.

A transfer arm 83 is provided at the central portion of the processing section B2. Arranged around the transfer arm 83 are a coating unit 84, a developing unit 85, a cleaning unit 86, and unit towers U1 and U2 each composed of heating units and/or cooling units piled-up vertically. As viewed from the carrier block B1, the coating unit 84 and the developing unit 85 are arranged on the left side, the cleaning unit 86 is arranged on the right side, the unit tower U1 is arranged on the near side, and the unit tower U2 is arranged on the far side. The coating unit 84 coats the substrate G with a resist solution. The developing unit 85 supplies a developing solution onto the substrate G having been exposed to cover the substrate surface with the solution, and maintains the solution as it is for a predetermined time, thereby performing a developing process. The cleaning unit 86 cleans the substrate G before it is coated with the resist solution.

Each of the unit towers U1 and U2 is composed of a plurality of units which are stacked vertically. As shown in FIG. 11, the unit tower U1 includes heat treatment units 2, cooling units 87, and a substrate transfer unit 88, which are placed at their respective vertical positions. The transfer arm 83 is movable horizontally and vertically and turnable about a vertical axis so as to convey the substrate G between the unit towers U1 and U2, the coating unit 84, the developing unit 85 and the cleaning unit 86. In FIG. 11, the transfer member 82 and the transfer arm 83 are omitted for simplicity of the drawing.

The processing section B2 is connected to the exposing apparatus B4 through an interface section B3. The interface section B3 is provided with a substrate transfer member 89, which is movable back and forth and right and left, is movable vertically, and is turnable about a vertical axis, and which transfers the substrate G between the processing section B2 and the exposing apparatus B4.

With the coating film forming system, a carrier C is delivered to the carrier stage 81 by an external carrier conveyer. A substrate G is removed from the carrier C by the substrate transfer member 82. The substrate G is transferred from the transfer member 82 to the transfer arm 83 through the transfer unit 88 of the unit tower U1, and then is conveyed to the processing units according to a predetermined sequence. In detail, the substrate G is conveyed to the cleaning unit 86 and subjected to a cleaning process, then subjected to a heat drying process by one of the heat treatment units 2, cooled to a predetermined temperature by the cooling unit, and coated with a resist solution which contains a component of a coating film dissolved in a solvent by the coating unit 84.

Subsequently, the substrate G is subjected to a pre-baking treatment by which the substrate G is heated so that the solvent in the resist solution is vaporized and thus removed. Then, the substrate G is cooled to a predetermined temperature by one of the cooling units 87. The substrate G is conveyed to the transfer unit 88 of the unit tower U2 by the transfer arm 83, is transferred to the transfer member 89 of the interface section B3, and is conveyed to the exposing unit B4 to be exposed. Thereafter, the substrate G is conveyed back to the processing section B2 through the interface section B3, and is subjected to a post-exposure baking treatment by which is substrate G is heated by one of the heat treatment units 2. Then, the substrate G is subjected to a developing process by which a developing solution is supplied onto the substrate G by one of the developing units 85. According to the above process steps, a circuit pattern is formed on the substrate G. The substrate G is conveyed back to the original carrier C by the transfer arm 83 and the transfer member 82 of the carrier block B1.

The invention claimed is:
1. A heat treatment apparatus comprising:
a hot plate having a heating element and adapted to support a substrate to be heat treated on or above the hot plate;

a first, non-contact thermometer adapted to measure temperature of a surface of the substrate supported by the hot plate without contacting the surface of the substrate;

a controller adapted to control electric power supplied to the heating element, the controller including a first control unit and a second control unit, the first control unit being configured to control the electric power in a first control mode during a first stage in which the temperature of the substrate rises from a first temperature to a second temperature, the second control unit being configured to control the electric power in a second control mode during a second stage after the first stage, wherein the first control unit includes:

a reference-power-value generator configured to generate, according to a power pattern, reference value of the electric power during the first stage, the power pattern defining change in the reference value of the electric power with time and determined prior to commencement of the first stage such that when the electric power is supplied to the heating element according to the power pattern, an actual temperature of the substrate rises to substantially trace a target temperature-rising curve that defines change in a target temperature of the substrate with time;

a subtractor configured to calculate deviation of temperature of the substrate measured by the first thermometer at a first point of time during the first stage from the target temperature at the first point of time defined by the target temperature-rising curve;

a compensation-value generator configured to generate at least one compensation value which is a function of the deviation, and of the temperature measured by the first thermometer at the first point of time or the target temperature at the first point of time; and a power-value corrector configured to correct the reference value by using the compensation value, thereby generating a corrected power value, which is a value of the electric power to be supplied to the heating element.

2. The heat treatment system according to claim 1, wherein the controller is configured to switch from the first control unit to the second control unit to control the electric power supplied to the heating element, when a predetermined time has elapsed from a point of time at which the first stage starts, or when the temperature of substrate measured by the first thermometer reaches a predetermined value.

3. The heat treatment apparatus according to claim 1, wherein the compensation value is a magnification factor by which the reference value multiplies, or is a value of electric power added to or subtracted from the reference value.

4. The heat treatment apparatus according to claim 1, wherein the compensation-value generator is configured to generate a first value as said at least one compensation value during a first time period, and to generate a second value as said at least one compensation value during a second time period following the first time period.

5. The heat treatment apparatus according to claim 1, wherein the first thermometer comprises a radiation thermometer.

6. The heat treatment apparatus according to claim 1, wherein:

the hot plate has a plurality of heating elements adapted to heat different areas of the hot plate;

a plurality of controllers is provided to control the electric power supplied to the heating elements, respectively.

7. The heat treatment apparatus according to claim 1, wherein the compensation-value generator and the power-value corrector are configured such that no correction of the reference value is conducted when absolute value of the deviation calculated by the subtractor is not greater than a predetermined threshold.

8. The heat treatment apparatus according to claim 1, wherein the compensation-value generator and the power-value corrector are configured such that correction of the reference value is conducted only two or three times during the first stage.

9. The heat treatment apparatus according to claim 1, wherein the compensation value generator has a table that represents compensation values as a function of the deviation at the point of time during the first stage and a parameter at the point of time during the first stage, where the parameter is selected from the group consisting of the temperature measured by the first thermometer at the first point of time during the first stage, and time elapsed from the substrate is placed on the hot plate at the first point of time during the first stage.

10. The heat treatment apparatus according to claim 1, further comprising a second thermometer adapted to measure temperature of the hot plate, wherein the second control unit is configured to control the electric power supplied to the heating element based on the temperature of the hot plate measured by the second thermometer so that actual temperature of the substrate coincides with a fixed target temperature.

11. The heat treatment system according to claim 10, wherein the second control mode is a PID control mode.

12. The heat treatment apparatus according to claim 1, wherein the controller is configured to control the electric power supplied to the heating element before the first stage by using the second control unit.

13. The heat treatment apparatus according to claim 12, wherein the controller is configured to switch from the second control unit to the first control unit to control the electric power supplied to the heating element, when the substrate is placed on or above the hot plate.

* * * * *